(12) United States Patent
Jang

(10) Patent No.: US 7,107,500 B2
(45) Date of Patent: Sep. 12, 2006

(54) TEST MODE CIRCUIT OF SEMICONDUCTOR MEMORY DEVICE

(75) Inventor: Ji Eun Jang, Sungnam-si (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 413 days.

(21) Appl. No.: 10/629,672

(22) Filed: Jul. 30, 2003

(65) Prior Publication Data

US 2004/0120178 A1 Jun. 24, 2004

(30) Foreign Application Priority Data

Dec. 24, 2002 (KR) .................. 10-2002-0083354

(51) Int. Cl.
*G11C 29/00* (2006.01)
*G11C 7/00* (2006.01)

(52) U.S. Cl. .......................... 714/718; 365/201

(58) Field of Classification Search ............. None
See application file for complete search history.

(56) References Cited

U.S. PATENT DOCUMENTS 6,333,879 B1 * 12/2001 Kato et al. ............. 365/201
6,343,048 B1    1/2002 Jung
6,392,909 B1    5/2002 Jang et al.
6,542,976 B1    4/2003 Barth et al.
6,813,739 B1 * 11/2004 Grannis, III ............ 714/729

FOREIGN PATENT DOCUMENTS

| JP | 01-095529 | 4/1989 |
| JP | 09-298221 | 11/1997 |
| JP | 2000-243098 | 9/2000 |
| JP | 2001-67894 | 3/2001 |
| JP | 2001-195898 | 7/2001 |
| JP | 2002-230996 | 8/2002 |

* cited by examiner

Primary Examiner—Phung My Chung
(74) Attorney, Agent, or Firm—Heller Ehrman LLP

(57) ABSTRACT

A test mode circuit of a semiconductor memory device features a test mode controller, a test mode decoder and a test mode item selecting means. The test mode controller outputs a test mode setting signal to control a test mode setting operation in response to a register set signal and address signals which are used in setting a test mode. The test mode decoder, which is controlled by the test mode setting signal, selects a test mode item group in response to upper address bits of the address signal. The particular test mode is then selected from the test mode group in response to lower address bits of the address signal. Accordingly, the number of metal lines used in a test mode circuit can be reduced.

16 Claims, 8 Drawing Sheets

TEST MODE CIRCUIT OF SEMICONDUCTOR MEMORY DEVICE

BACKGROUND OF THE INVENTION

1. Background of the Invention

The present invention relates to test mode circuits of semiconductor memory devices, and more specifically, to a test mode circuit of a semiconductor memory device which reduces the number of metal lines used for selecting a test mode item by grouping the test mode items.

2. Description of the Prior Art

FIG. 1 is a block diagram illustrating a conventional test mode circuit of a semiconductor memory device.

The conventional test mode circuit comprises a test mode controller 1, an address decoder 2 and a test mode decoder 3.

The test mode controller 1 is controlled by a mode register set signal MRS, and outputs a test mode setting signal TMS and a test mode end signal TME for setting a test mode depending on states of an address signal ADD<7>.

The mode register set signal MRS is generated at a rising edge of an inputted clock signal when a row address strobe signal /RAS, a column address strobe signal /CAS, a chip selecting signal /CS and a write enable signal /WE are simultaneously at a low level (not shown).

The address decoder 2 decodes address signals ADD<0:5>, and outputs decoding address signals TMADD<0:63> for selecting each test mode item. Here, a test mode circuit using 64 test mode items is exemplified. Accordingly, the decoding address signal TMADD<0:63> of 64 bits obtained by decoding the address signal ADD<0:5> of 6 bits is used to select each test mode item.

The test mode decoder 3 is controlled by the test mode setting signal TMS and the test mode end signal TME, and selects each test mode item in response to the decoding address signals TMADD<0:63>. The test mode decoder 3 activates corresponding test mode item selecting signals TM<0:63> to select a specific test mode item so that a test may be performed using the specific test mode item.

FIG. 2 is a circuit diagram illustrating the test mode controller 1 of FIG. 1.

The test mode controller 1 comprises NAND gates NDS and NDE, and inverters INS and INE. The NAND gate NDS performs a NAND operation on the mode register set signal MRS and the address signal ADD<7>. The inverter INS inverts an output signal from the NAND gate NDS, and outputs the test mode setting signal TMS. The NAND gate NDE performs a NAND operation on the mode register set signal MRS and an inverted address signal /ADD<7> outputted by the inverter INV. The inverter INE inverts an output signal from the NAND gate NDE, and outputs the test mode end signal TME.

FIG. 3 is a circuit diagram illustrating the address decoder 2 of FIG. 1.

The address decoder 2 comprises inverters INV0~INV5, NAND gates ND10~ND163, and inverters INV10~INV163. The inverters INV0~INV5 invert address signals ADD<0:5>, respectively. The NAND gates ND10~ND163 perform NAND operations on address signals ADD<0:5> and output signals from the inverters INV0~INV5. The inverters INV10~INV163 invert output signals from the NAND gates ND10~ND163, and output decoding address signals TMADD<0:63>.

FIG. 4 is a circuit diagram illustrating the test mode decoder 3 of FIG. 1.

The test mode decoder 3 comprises 64 test mode item selecting means 4. The test mode item selecting means 4 is controlled by the test mode setting signal TMS and the test mode end signal TME, and outputs test mode item selecting signals TM<0:63> for selecting each test mode item in response to the decoding address signals TMADD<0:63>.

Each test mode item selecting means 4 comprises a PMOS transistor PM1, NMOS transistor NM1 and NM2, and a latch 5. The PMOS transistor PM1 has a gate to receive the test mode end signal TME. The NMOS transistor NM1 has a gate to receive the test mode setting signal TMS. The NMOS transistor NM2 has a gate to receive a corresponding signal of the decoding address signals TMADD<0:63>. The latch 5 is connected to a common drain of the PMOS transistor PM1 and the NMOS transistor NM1. The latch 5 comprises inverters INL1 and INL2. An output signal from the inverter INL1 is inputted to an input terminal of the inverter INL2, and an output signal from the inverter INL2 is inputted to an input terminal of the inverter INL1.

Next, the operation of the conventional test mode circuit is described.

If a system is activated when the mode register set signal MRS transitions to a high level, a test mode is set depending on the state of the address signal ADD<7>.

If the address signal ADD<7> is at a high level, the test mode setting signal TMS transitions to a high level to activate the test mode.

When one of the decoding address signals TMADD<0:63> transitions to a high level, a test mode item selecting signal outputted from the corresponding test mode item selecting means 4 is enabled to a high level.

Thereafter, a test circuit corresponding to the activated test mode item selecting signal sets a test mode, and is prepared to perform a test.

In the conventional test mode circuit, the peripheral circuit region is enlarged because a corresponding metal line is required for setting each test mode item. As a result, cell efficiency is degraded.

SUMMARY OF THE INVENTION

Accordingly, it is an object of the present invention to provide a test mode circuit comprising a group having a predetermined number of test mode items to reduce the number of metal lines associated with the circuit.

In an embodiment of the present invention, there is provided a test mode circuit of a semiconductor memory device comprising a test mode controller, a test mode decoder and a test mode item selecting means. The test mode controller outputs a test mode setting signal to control a test mode setting operation in response to a mode register set signal and an address signals which are used in setting a test mode. The test mode decoder, controlled by the test mode setting signal, selects a test mode item group in response to upper address bits of the address signal. The test mode item selecting means selects a predetermined test mode item of the test mode item group selected by the test mode decoder in response to lower address bits of the address signal. The test mode item group includes a predetermined number of test mode items among a plurality of test mode items as a unit.

DETAILED DESCRIPTION OF THE PREFERRED EMBODIMENTS

The present invention will be described in detail with reference to the attached drawings.

Figure 1:
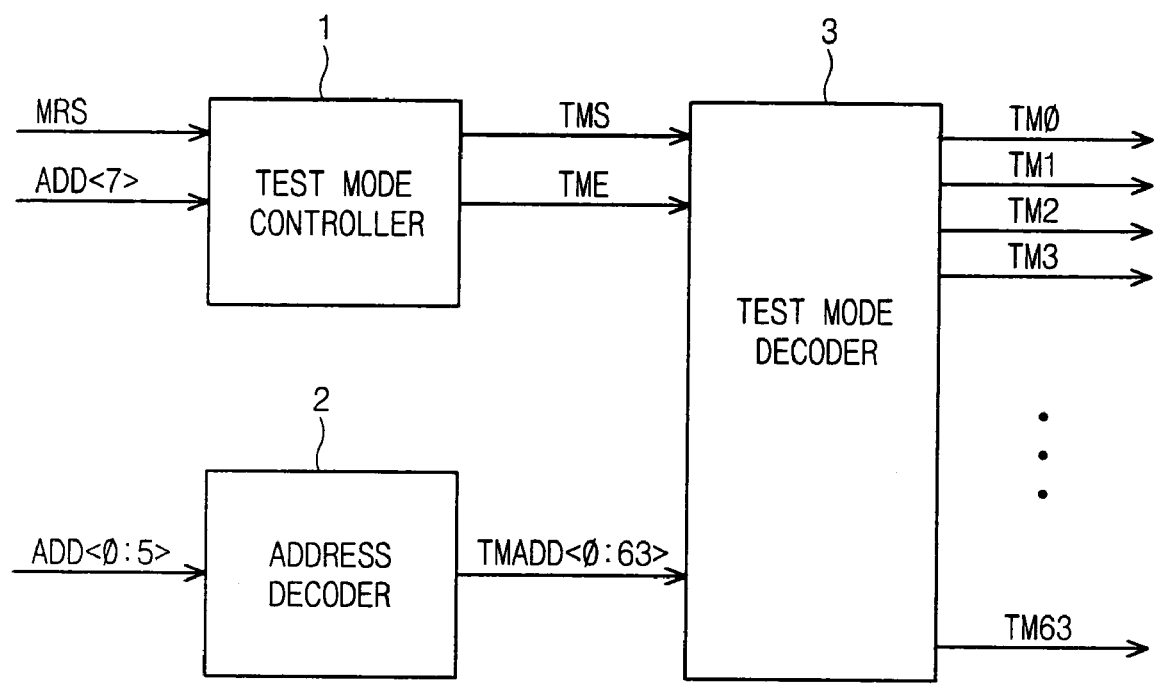
FIG. 1 is a block diagram illustrating a conventional test mode circuit of a semiconductor memory device.
Figure 2:
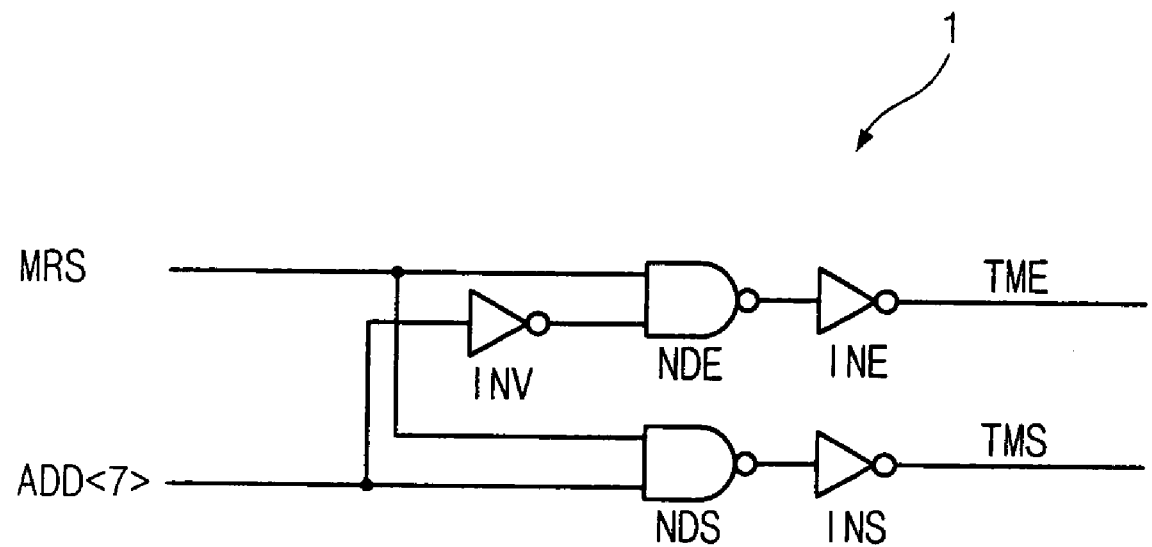
FIG. 2 is a circuit diagram illustrating a conventional test mode controller of FIG. 1.
Figure 3:
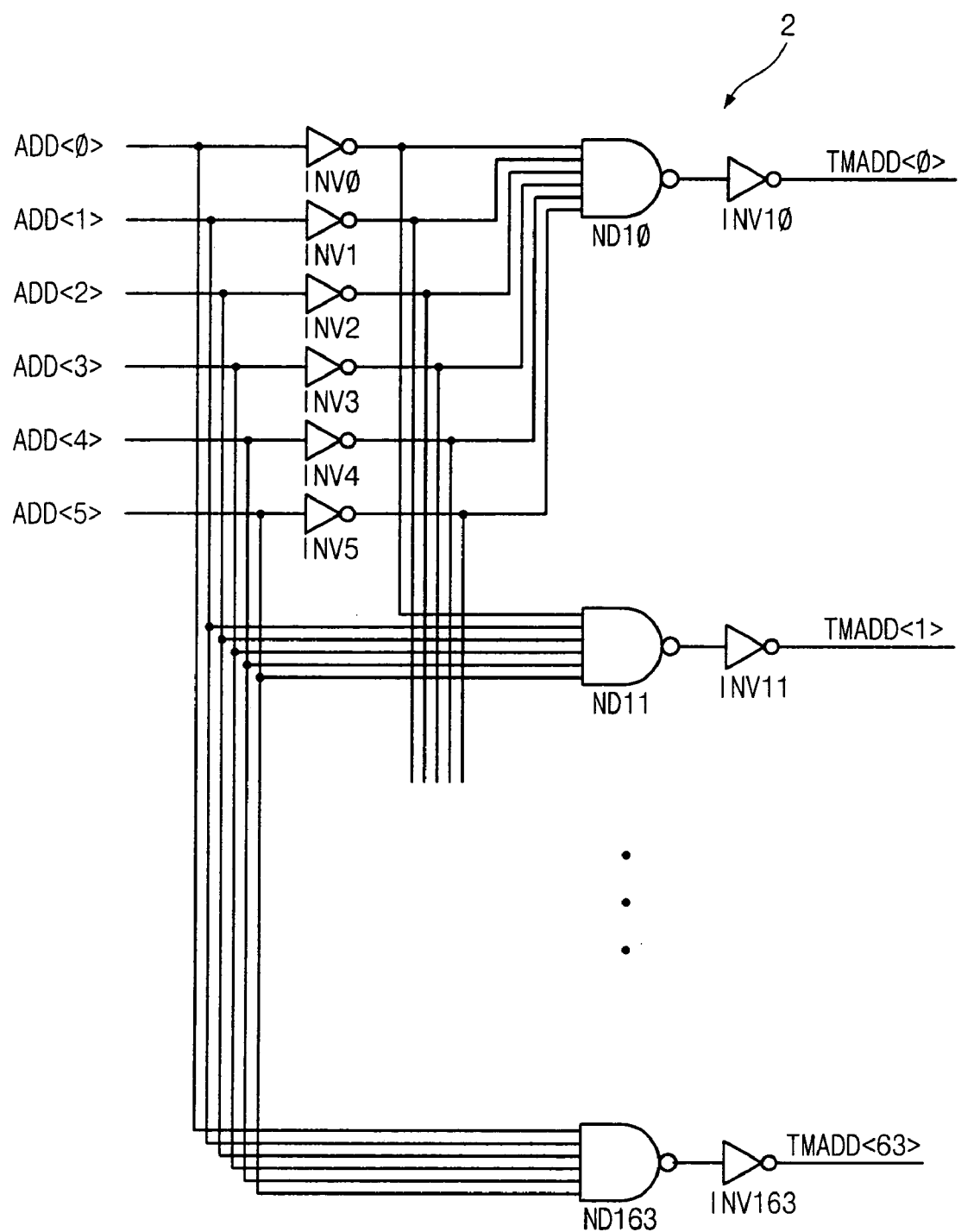
FIG. 3 is a circuit diagram illustrating a conventional address decoder of FIG. 1.
Figure 4:
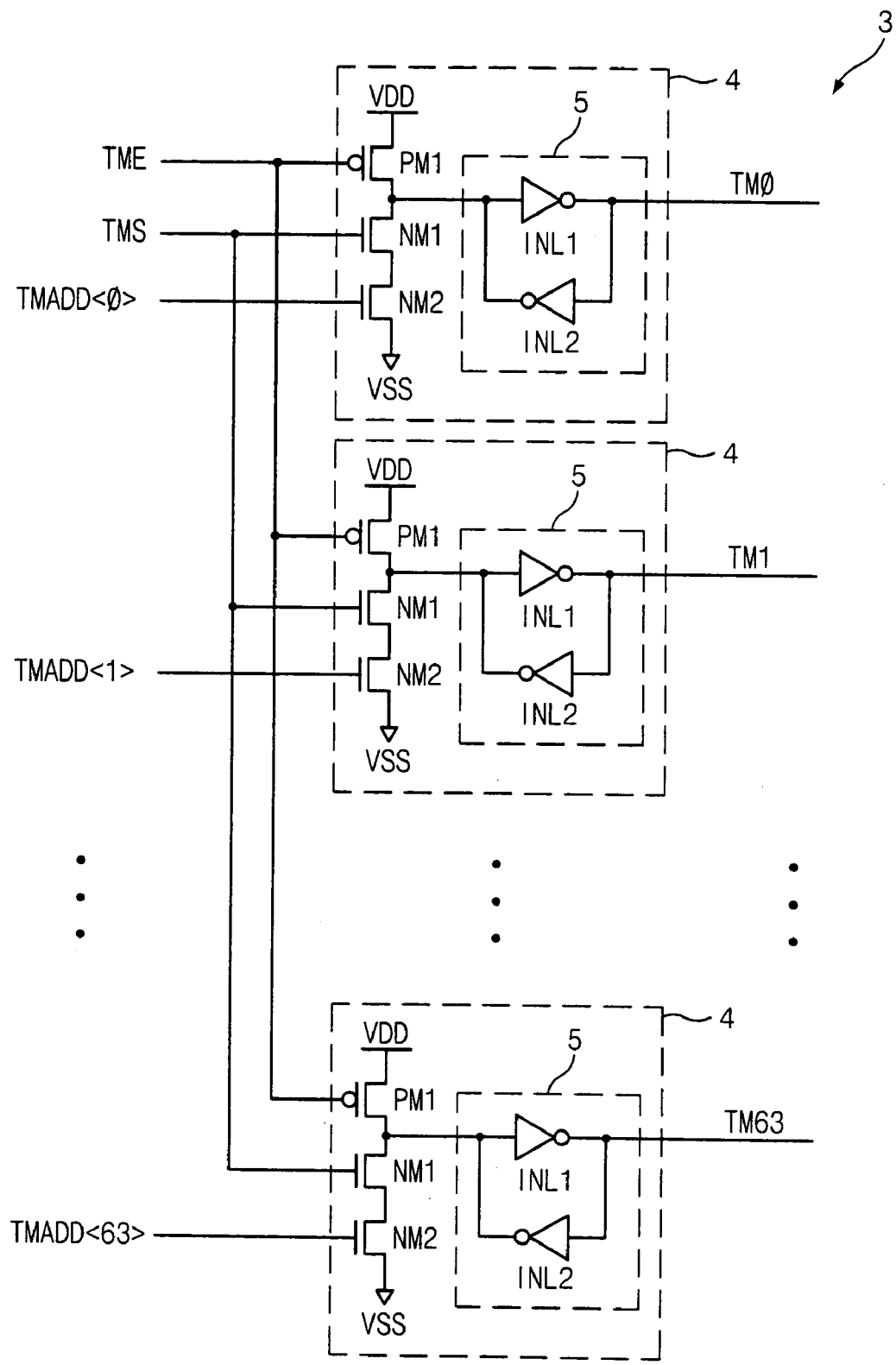
FIG. 4 is a circuit diagram illustrating a conventional test mode decoder of FIG. 1.
Figure 5:
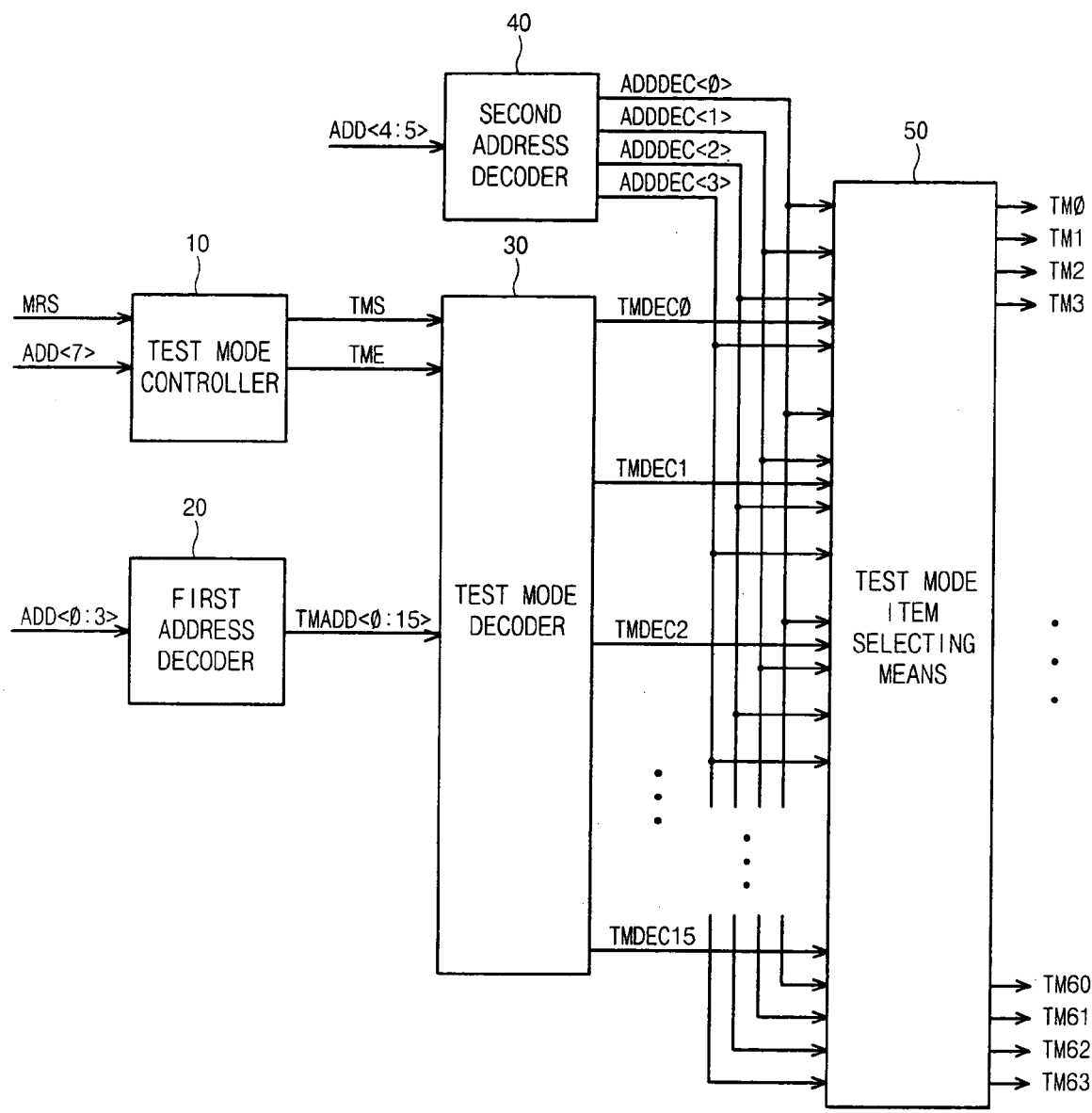
FIG. 5 is a block diagram illustrating a test mode circuit of a semiconductor memory device according to an embodiment of the present invention.

FIG. 5 is a block diagram illustrating a test mode circuit of a semiconductor memory device according to an embodiment of the present invention.

In an embodiment, the test mode circuit comprises a test mode controller 10, a first address decoder 20, a test mode decoder 30, a second address decoder 40 and a test mode item selecting means 50.

The test mode controller 10 is controlled by a mode register set signal MRS, and outputs a test mode setting signal TMS and a test mode end signal TME for setting a test mode depending on states of an address signal ADD<7>.

The first address decoder 20 decodes address signals ADD<0:3>, and outputs decoding address signals TMADD<0:15> for selecting each test mode item group.

The test mode decoder 30 is controlled by the test mode setting signal TMS and the test mode end signal TME, and outputs test mode item group selecting signals TMDEC<0:15> for selecting each test mode item group in response to the decoding address signals TMADD<0:15>.

The second address decoder 40 decodes address signals ADD<4:5>, and outputs decoding address signals ADDDEC<0:3> for selecting a desired test mode item of the selected test mode item group.

The test mode item selecting means 50 outputs test mode item selecting signals TM<0:63> for selecting a desired test mode item in response to the decoding address signals ADDDEC<0:3> of the test mode item group selected by the test mode item group selecting signals TMDEC<0:15>.

Figure 6:
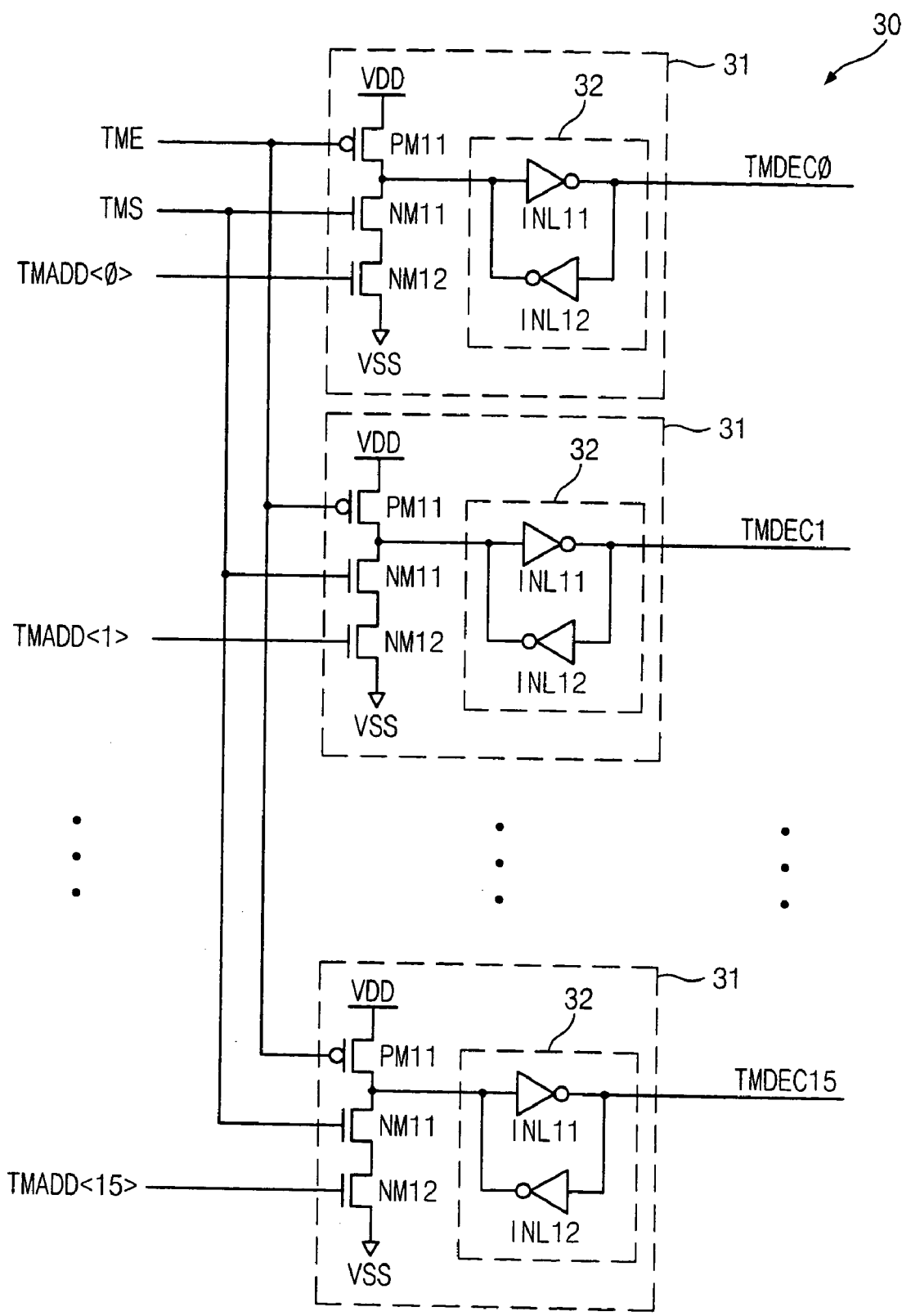
FIG. 6 is a circuit diagram illustrating a test mode decoder of FIG. 5.

FIG. 6 is a circuit diagram illustrating the test mode decoder 30 of FIG. 5.

The test mode decoder 30 comprises 16 test mode item selecting means 31. The test mode item selecting means 31 are controlled by the test mode setting signal TMS and the test mode end signal TME, and output the test mode item group selecting signals TMDEC<0:15> for selecting each test mode item group in response to the decoding address signals TMADD<0:15>.

Each test mode item selecting means 31 comprises a PMOS transistor PM11, NMOS transistors NM11 and NM12, and a latch 32. The PMOS transistor PM11 has a gate to receive the test mode end signal TME. The NMOS transistor NM11 has a gate to receive the test mode setting signal TMS. The NMOS transistor NM12 has a gate to receive a corresponding signal of the decoding address signals TMADD<0:15>. The latch 32 is connected to a common drain of the PMOS transistor PM11 and the NMOS transistor NM11. The latch 32 comprises inverters INL11 and INL12. An output signal from the inverter INL11 is inputted to an input terminal of the inverter INL12, and an output signal from the inverter INL12 is inputted to an input terminal of the inverter INL11.

Figure 7:
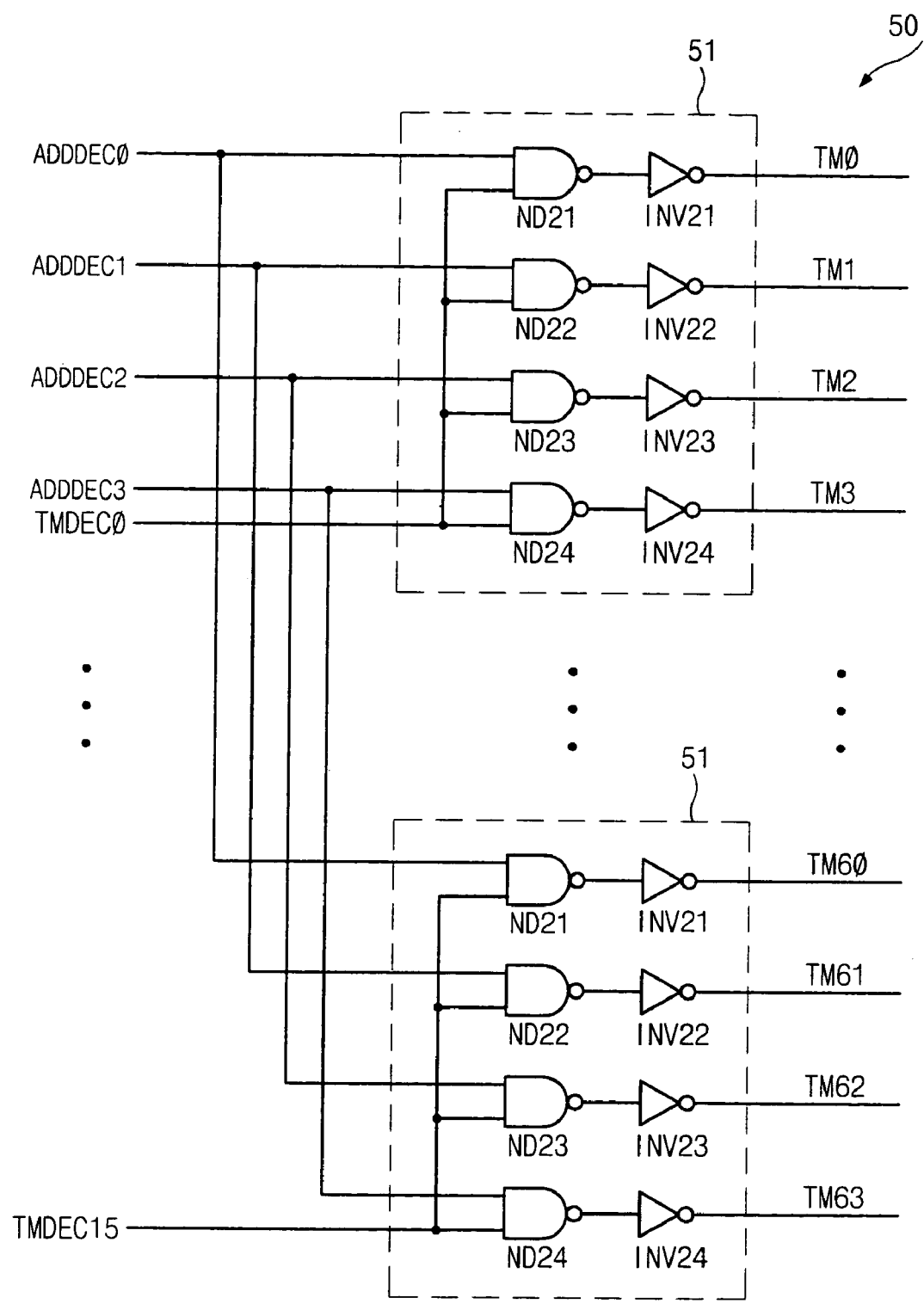
FIG. 7 is a circuit diagram illustrating a test mode item selecting signal generator of FIG. 5.

FIG. 7 is a circuit diagram illustrating the test mode item selecting means 50 of FIG. 5.

The test mode item selecting means 50 comprises 16 unit selecting means 51. The unit selecting means 51 output test mode item selecting signals TM<0:63> for selecting a desired test mode item of the test mode item group selected by the test mode item group selecting signal TMDEC<0:15> in response to the decoding address signals ADDDEC<0:3>.

The unit selecting means 51 comprises NAND gates ND21~ND24, and inverters INV21~INV24. The NAND gates ND21~ND24 perform NAND operations on the decoding address signals ADDEC<0:3> and a corresponding signal of the test mode item group selecting signals TMDEC<0:15>. The inverters INV21~INV24 invert output signals from the NAND gates ND21~ND24, and output the test mode item selecting signals TM<0:63>.

The explanation of the address decoders 20 and 40 is omitted because conventional decoder circuits such as described above are used therein.

Next, the operation of the test mode circuit according to an embodiment of the present invention is described.

If a system is activated when the mode register set signal MRS transitions to a high level in the test mode controller 10, the state of a test mode is set depending on the state of the address signal ADD<7>.

For example, if the address signal ADD<7> is at a high level, the test mode setting signal TMS transitions to a high level to enable the test mode.

Here, if a desired signal of the decoding address signals TMADD<0:15> transitions to a high level to select a desired test mode item group in the test mode decoder(30), a corresponding signal of the test mode item group selecting signals TMDEC<0:15> is enabled to a high level.

If a desired signal among the decoding address signals ADDDEC<0:3> transitions to a high level to select a desired test mode item in the test mode item selecting means 50, a desired signal among the test mode item selecting signals TM<0:63> is activated because the unit selecting means 51 corresponding to a signal enabled to a high level among the test mode item group selecting signals TMDEC<0:15> is already activated.

As a result, a corresponding test circuit sets a test mode, and is prepared to perform a test.

Figure 8:
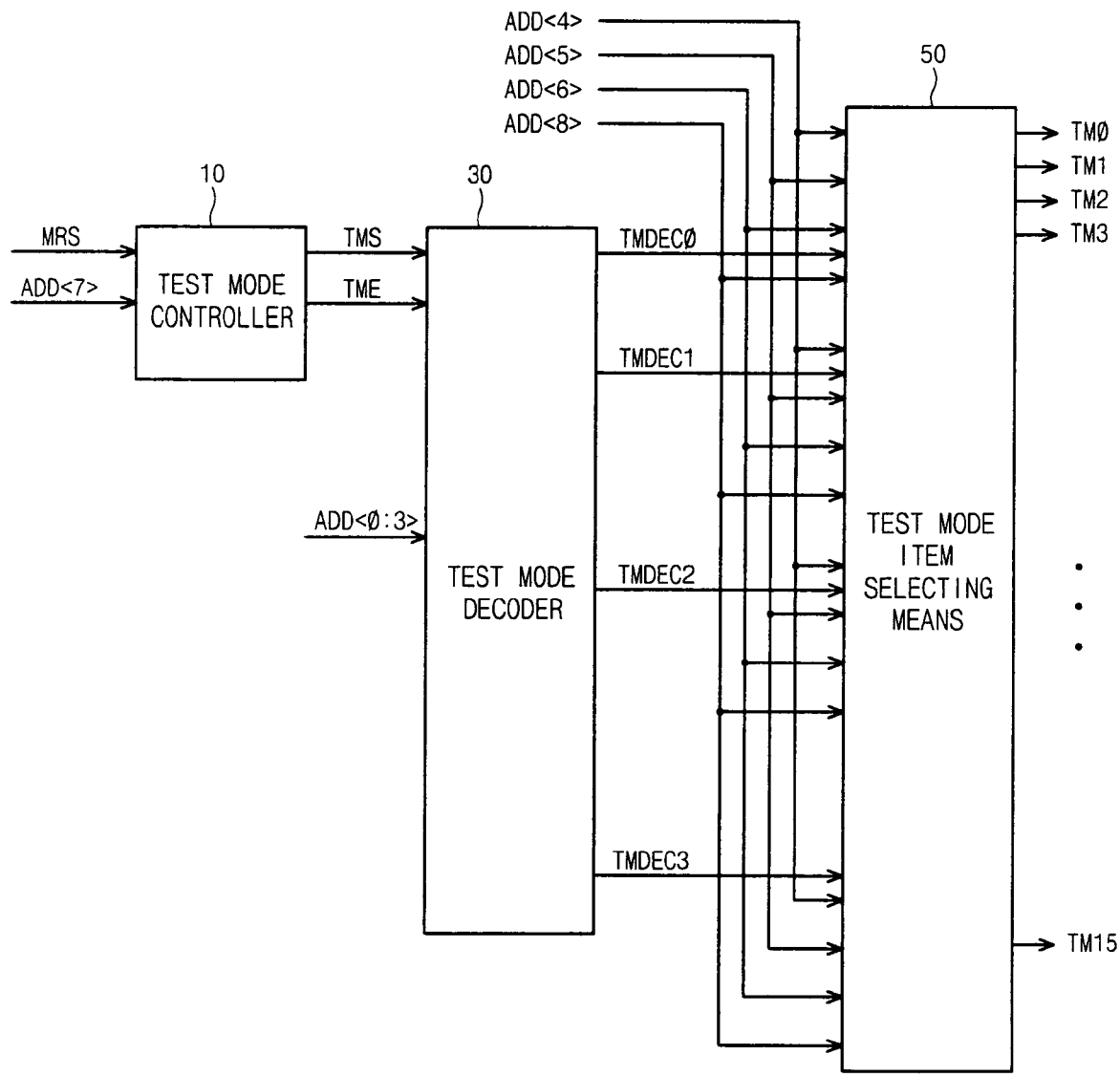
FIG. 8 is a block diagram illustrating a test mode circuit of a semiconductor memory device according to another embodiment of the present invention.

FIG. 8 is a block diagram illustrating a test mode circuit of a semiconductor memory device according to another embodiment of the present invention. Here, a test mode circuit selecting 16 test mode items is exemplified.

In an embodiment of the present invention, the test mode circuit comprises a test mode controller 10, a test mode decoder 30 and a test mode item selecting means 50.

The test mode decoder 30 is controlled by a test mode setting signal TMS and a test mode end signal TME, and outputs test mode item group selecting signals TMDEC<0:3> for selecting each test mode item group in response to address signals ADD<0:3>.

The test mode item selecting means 50 outputs test mode item group selecting signals TM<0:15> for selecting a desired test mode item out of the test mode item group selected by the test mode item group selecting signals TMDEC<0:3> in response to address signals ADD<4:8>.

Here, the explanation on the operation of the test mode circuit of FIG. 8 is omitted because it is identical to that of FIG. 5.

In the test mode circuit of FIG. 8, the address decoders 20 and 40 of FIG. 5 are not used. Instead, the address signals ADD<0:3> are directly inputted to the test mode decoder 30, and the address signals ADD<4:8> are directly inputted to the test mode item selecting means 50. When compared with that of FIG. 5, the test mode circuit of FIG. 8 does not require the address decoders 20 and 40. As a result, the configuration of the circuit can be simplified.

Accordingly, in a test mode circuit of a semiconductor memory device according to an embodiment of the present invention, the number of metal lines can be reduced because the test mode circuit having a group comprising a predetermined number of test mode items selects a test mode item group.

While the present invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A circuit for activating a test mode of a semiconductor memory device, comprising:
    a test mode controller means for outputting a test mode setting signal to control a test mode setting operation in response to a mode register set signal and an address signal;
    a test mode decoder means, controlled by the test mode setting signal, for selecting a test mode item group among a plurality of test mode item groups in response to upper address bits of the address signal; and
    a test mode item selecting means for selecting a predetermined test mode item out of the test mode item group selected by the test mode decoder means in response to lower address bits of the address signal,
    wherein the test mode item group comprises a predetermined number of test mode items among a plurality of test mode items.

2. The circuit according to claim 1, wherein the test mode decoder means comprises a plurality of group selecting means for outputting a plurality of group selecting signals in response to upper address bits of the address signal,
    wherein each of the plurality of group selecting signals is a signal to select a predetermined test mode item group among the plurality of test mode item groups.

3. The circuit according to claim 2, wherein each of the group selecting means comprises:
    a pull-up means for pulling up an output terminal in response to a first signal outputted from the test mode controller means; and
    a first pull-down means for pulling down the output terminal in response to the corresponding upper address bits.

4. The circuit according to claim 3, wherein each of the group selecting means is connected between the output terminal and the first pull-down means and further comprises a second pull-down means for pulling down the output terminal in response to a second signal outputted from the test mode controller means.

5. The circuit according to one of claims 3 and 4, wherein each group selecting means further comprises a latch means for maintaining a potential of the output terminal.

6. The circuit according to claim 1, wherein the test mode item selecting means comprises a plurality of item selecting means for selecting a corresponding test mode item out of the test mode item group selected by an output signal from the test mode decoder means in response to the lower address bits.

7. The circuit according to claim 1, further comprising a first address decoder means for decoding the upper address bits and outputting a first decoded address signal to the test mode decoder means.

8. The circuit according to one of claims 1 and 7, further comprising a second address decoder means for decoding the lower address bits and outputting a second decoded address signal to the test mode item selecting means.

9. A circuit for activating a test mode of a semiconductor memory device, comprising:
    a test mode controller circuit configured to output a test mode setting signal suitable for controlling a test mode setting operation in response to a mode register set signal and an address signal;
    a test mode group decoder circuit configured to receive the test mode setting signal and upper address bits of the address signal and, in response thereto, output a test mode group signal indicating a test mode item group selected from among a plurality of test mode item groups; and
    a test mode selecting circuit configured to receive lower address bits of the address signal and the test mode group signal and, in response thereto, output a test mode item signal indicating a selected test mode to be performed,
    wherein the test mode item group comprises a predetermined number of test modes among a plurality of test modes.

10. The circuit according to claim 9, wherein the test mode group decoder circuit receives the test mode setting signal and further comprises a plurality of group selecting circuits configured to receive upper address bits of the address signal and output a plurality of group selecting signals in response thereto,
    wherein each of the plurality of group selecting signals is a signal indicating selection of a predetermined test mode item group from among the plurality of test mode item groups.

11. The circuit according to claim 10, wherein each of the plurality of group selecting circuits further comprises:
    a pull-up circuit coupled to an output terminal and the test mode controller circuit and configured to pull up a voltage on the output terminal in response to a first signal received from the test mode controller circuit; and
    a first pull-down circuit configured to receive the upper address bits and pull down the voltage on the output terminal in response thereto.

12. The circuit according to claim 11, wherein each of the plurality of group selecting circuits is connected between the output terminal and the first pull-down circuit and further comprises a second pull-down circuit coupled to the output terminal and the test mode controller circuit and configured to pull down the voltage on the output terminal in response to a second signal received from the test mode controller circuit.

13. The circuit according to claim 11, wherein each of the plurality of group selecting circuits further comprises a latch circuit configured to maintain a voltage potential of the output terminal.

14. The circuit according to claim 9, wherein the test item selecting circuit comprises a plurality of mode selecting circuits each coupled to the test mode group decoder circuit and configured to receive the lower address bits and output a particular test mode signal in response to an output signal received from the test mode group decoder circuit and the lower address bits.

15. The circuit according to claim 9, further comprising a first address decoder circuit configured to receive the upper address bits and, in response thereto, output a first decoded address signal to the test mode group decoder circuit.

16. The circuit according to claim 15, further comprising a second address decoder circuit configured to receive the lower address bits and, in response thereto, outputting a second decoded address signal to the test mode selecting circuit.

* * * * *